(12) United States Patent
Prall

(10) Patent No.: US 6,586,304 B2
(45) Date of Patent: Jul. 1, 2003

(54) SEMICONDUCTOR-ON-INSULATOR TRANSISTOR, MEMORY CIRCUITRY EMPLOYING SEMICONDUCTOR-ON-INSULATOR TRANSISTORS, METHOD OF FORMING A SEMICONDUCTOR-ON-INSULATOR TRANSISTOR, AND METHOD OF FORMING MEMORY CIRCUITRY EMPLOYING SEMICONDUCTOR-ON-INSULATOR TRANSISTORS

(75) Inventor: Kirk Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 08/881,852

(22) Filed: Jun. 24, 1997

(65) Prior Publication Data

US 2002/0048883 A1 Apr. 25, 2002

Related U.S. Application Data

(62) Division of application No. 08/668,388, filed on Jun. 21, 1996, now Pat. No. 5,929,476.

(51) Int. Cl.⁷ .............................................. H01L 21/336
(52) U.S. Cl. ........................ 438/268; 438/270; 438/311
(58) Field of Search ................................. 438/206, 311, 438/268, 270, 272, 386, 387, 212; 257/347, 296, 774, 330, 382, 750, 758, 760

(56) References Cited

U.S. PATENT DOCUMENTS

| 3,962,713 A | 6/1976 | Kendall ....................... 257/599 |
| 4,409,608 A | 10/1983 | Yoder ......................... 257/534 |
| 4,614,021 A | 9/1986 | Hulseweh .................... 216/13 |

(List continued on next page.)

FOREIGN PATENT DOCUMENTS

| DE | 44 43 968 | 11/1995 |
| EP | 0175433 | 3/1986 |
| EP | 0315803 | 5/1989 |

(List continued on next page.)

OTHER PUBLICATIONS

T. Hamamoto et al., "NAND–Structured Cell Techniques for Low Cost 256Mb DRAMs", IEDM 1993, pp. 643–646.

Primary Examiner—Amir Zarabian
Assistant Examiner—Jeff Vockrodt
(74) Attorney, Agent, or Firm—Wells, St. John, P.S.

(57) ABSTRACT

The invention includes several aspects related to semiconductor-on-insulator transistors, to memory and other DRAM circuitry and arrays, to transistor gate arrays, and to methods of fabricating such constructions. In one aspect, a semiconductor-on-insulator transistor includes, a) an insulator layer; b) a layer of semiconductor material over the insulator layer; c) a transistor gate provided within the semiconductor material layer; and d) an outer elevation source/drain diffusion region and an inner elevation diffusion region provided within the semiconductor material layer in operable proximity to the transistor gate. In another aspect, DRAM circuitry includes a plurality of memory cells not requiring sequential access, at least a portion of the plurality having more than two memory cells for a single bit line contact. In still another aspect, a DRAM array of memory cells comprises a plurality of wordlines, source regions, drain regions, bit lines in electrical connection with the drain regions, and storage capacitors in electrical connection with the source regions; at least two drain regions of different memory cells being interconnected with one another beneath one of the wordlines. In yet another aspect, a DRAM array has more than two memory cells for a single bit line contact, and a plurality of individual memory cells occupy a surface area of less than or equal to 2f×(2f+f/N), where "f" is the minimum photolithographic feature size with which the array was fabricated, and "N" is the number of memory cells per single bit line contact within the portion.

19 Claims, 9 Drawing Sheets

U.S. PATENT DOCUMENTS

| | | | |
|---|---|---|---|
| 4,630,088 A | 12/1986 | Ogura | 257/302 |
| 4,710,790 A | 12/1987 | Okamoto et al. | 357/23.6 |
| 4,864,375 A * | 9/1989 | Teng et al. | 257/302 |
| 4,882,291 A | 11/1989 | Jeuch | 438/424 |
| 4,906,585 A | 3/1990 | Neppl et al. | 438/425 |
| 4,951,102 A * | 8/1990 | Beitman et al. | 257/329 |
| 4,961,100 A | 10/1990 | Baliga | 257/330 |
| 4,982,266 A | 1/1991 | Chatterjee | 257/758 |
| 5,010,386 A * | 4/1991 | Groover, III | 257/369 |
| 5,016,068 A * | 5/1991 | Mori | 257/330 |
| 5,122,476 A | 6/1992 | Fazan et al. | 438/241 |
| 5,124,764 A * | 6/1992 | Mori | 257/334 |
| 5,281,837 A | 1/1994 | Kohyama | 257/296 |
| 5,283,456 A * | 2/1994 | Hsieh et al. | 257/347 |
| 5,298,780 A | 3/1994 | Harada | 257/330 |
| 5,302,846 A | 4/1994 | Matsumoto | 257/329 |
| 5,307,310 A | 4/1994 | Narita | 257/330 |
| 5,312,782 A * | 5/1994 | Miyazawa | 438/270 |
| 5,340,754 A | 8/1994 | Witek | 438/156 |
| 5,340,759 A | 8/1994 | Hsieh et al. | 438/156 |
| 5,355,330 A | 10/1994 | Hisamoto | 365/149 |
| 5,357,131 A | 10/1994 | Sunami et al. | 257/301 |
| 5,360,753 A | 11/1994 | Park et al. | 438/421 |
| 5,378,914 A * | 1/1995 | Ohzu et al. | 257/369 |
| 5,378,919 A | 1/1995 | Ochiai | 257/204 |
| 5,443,992 A * | 8/1995 | Risch et al. | 438/270 |
| 5,480,838 A | 1/1996 | Mitsui | 437/203 |
| 5,497,017 A | 3/1996 | Gonzales | 257/330 |
| 5,508,541 A | 4/1996 | Hieda | 257/301 |
| 5,528,062 A | 6/1996 | Hsieh et al. | 257/298 |
| 5,529,948 A * | 6/1996 | Lur et al. | 438/450 |
| 5,563,083 A | 10/1996 | Pein | 438/259 |
| 5,573,837 A | 11/1996 | Roberts et al. | 438/210 |
| 5,578,850 A | 11/1996 | Fitch | 257/329 |
| 5,616,961 A | 4/1997 | Kohyama | 257/774 |
| 5,627,390 A | 5/1997 | Maeda | 257/302 |
| 5,627,393 A | 5/1997 | Hsu | 257/331 |
| 5,693,547 A * | 12/1997 | Gardner et al. | 438/270 |
| 5,705,409 A * | 1/1998 | Witek | 438/212 |
| 5,712,500 A | 1/1998 | Hsue | 257/315 |
| 5,736,760 A | 4/1998 | Hieda et al. | 257/301 |
| 5,804,851 A | 9/1998 | Noguchi et al. | 257/304 |
| 5,929,476 A | 7/1999 | Prall | 257/296 |

FOREIGN PATENT DOCUMENTS

| | | |
|---|---|---|
| EP | 0472726 A1 | 3/1990 |
| EP | 04 176168 | 6/1992 |
| EP | 0575278 A2 | 5/1993 |
| JP | 55-65463 | 5/1980 |
| JP | 61 144875 A | 7/1986 |
| JP | 61-206253 * | 9/1986 |
| JP | 63 040376 | 2/1988 |
| JP | 4-34980 | 2/1992 |
| JP | 4-268767 | 9/1992 |
| JP | 5-121691 | 5/1993 |

* cited by examiner

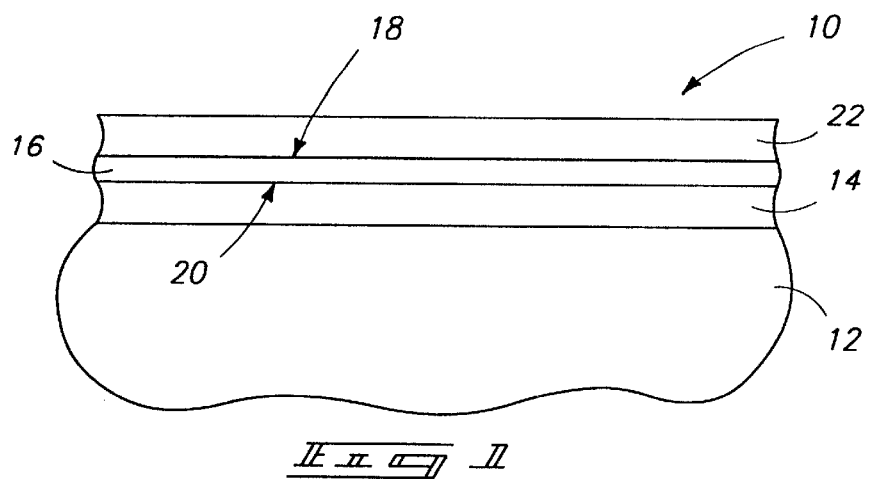
_Fig 1_
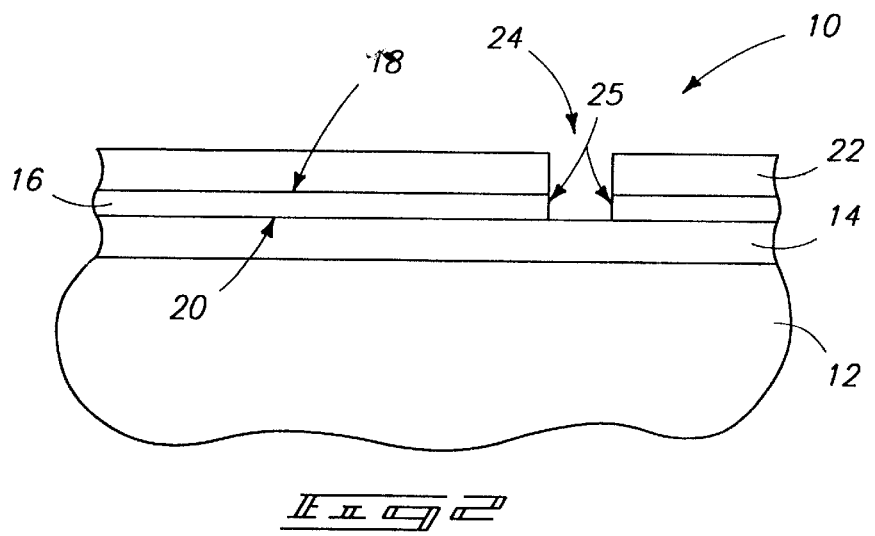
_Fig 2_
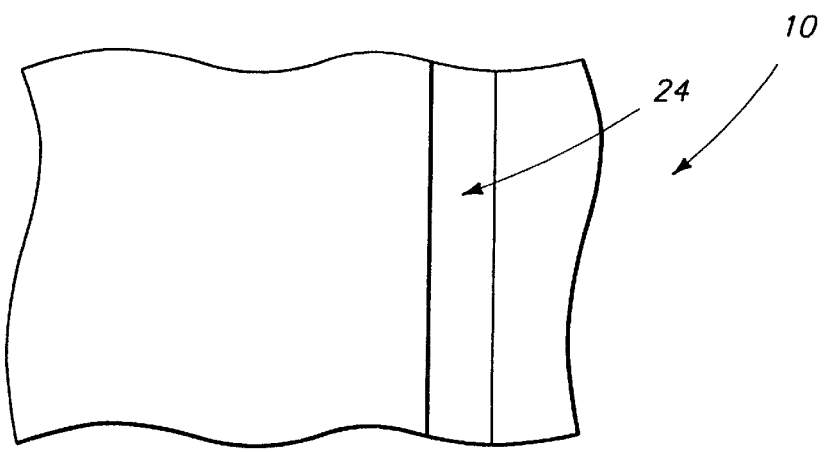
_Fig 3_

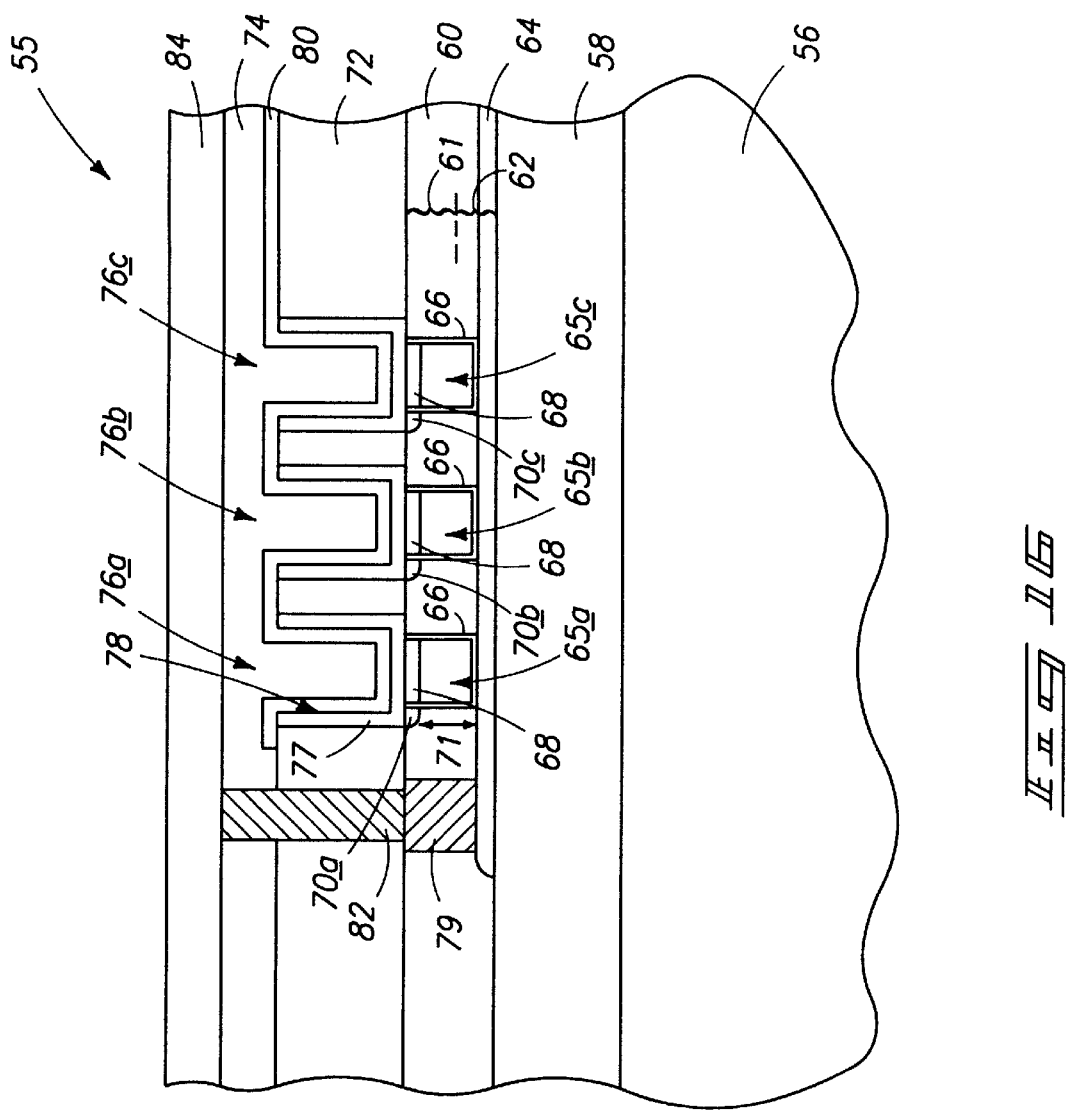

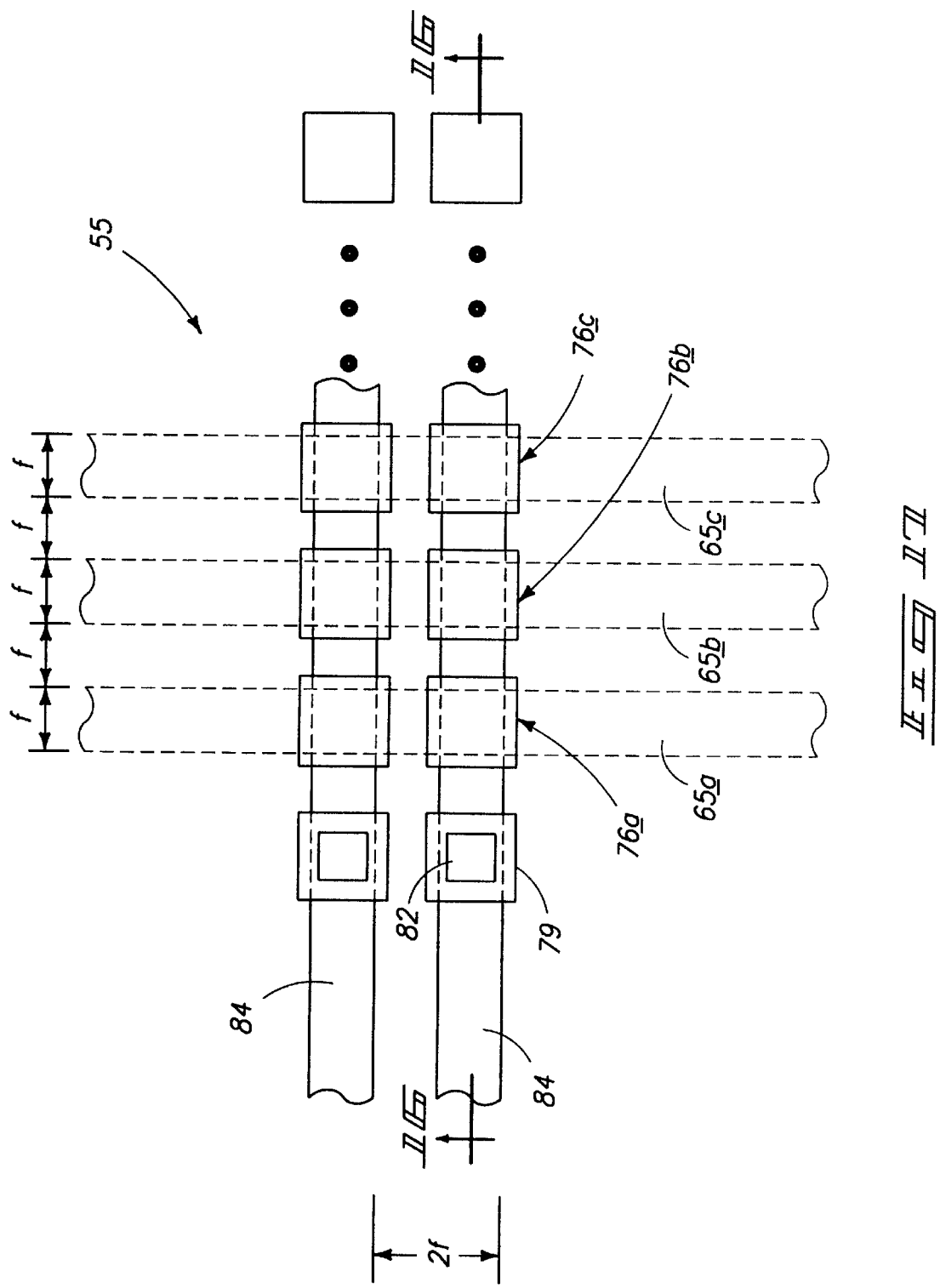

SEMICONDUCTOR-ON-INSULATOR TRANSISTOR, MEMORY CIRCUITRY EMPLOYING SEMICONDUCTOR-ON-INSULATOR TRANSISTORS, METHOD OF FORMING A SEMICONDUCTOR-ON-INSULATOR TRANSISTOR, AND METHOD OF FORMING MEMORY CIRCUITRY EMPLOYING SEMICONDUCTOR-ON-INSULATOR TRANSISTORS

RELATED PATENT DATA

This patent resulted from a divisional application of U.S. patent application Ser. No. 08/668,388, filed Jun. 21, 1996 entitled "Semiconductor-On-Insulator Transistor, Memory Circuitry Employing Semiconductor-On-Insulator Transistors, Method of Forming a Semiconductor-On-Insulator Transistor, and Method of Forming Memory Circuitry Employing Semiconductor-On-Insulator Transistors", naming Kirk Prall as inventor, and which is now U.S. Pat. No. 5,929,476.

TECHNICAL FIELD

This invention relates generally to semiconductor-on-insulator transistors, DRAM and other circuitry employing semiconductor-on-insulator transistors, methods of forming a semiconductor-on-insulator transistors, and methods of forming memory circuitry employing semiconductor-on-insulator transistors.

BACKGROUND OF THE INVENTION

Field effect transistors are typically comprised of a pair of diffusion regions, typically referred to as a source and a drain, spaced apart within a semiconductor substrate. Such include a gate provided adjacent to a separation region between the diffusion regions for imparting an electric field to enable current to flow between the diffusion regions. The substrate area adjacent the gate in between the diffusion regions is referred to as the channel.

The semiconductive substrate typically comprises a bulk monocrystalline silicon substrate having a light conductivity dopant impurity concentration. The diffusion regions typically have a considerably higher dopant concentration of a conductivity enhancing impurity of an opposite type. Alternately, the substrate can be provided in the form of a thin layer of lightly doped semiconductive material over an underlying insulator layer. Such are commonly referred to a semiconductor-on-insulator (SOI) constructions. The diffusion regions in SOI constructions can extend completely through the thin silicon layer, which is commonly referred to as a fully depleted SOI construction. Alternately, the diffusion regions may extend only partially into or through the thickness of the thin silicon layer, something which is commonly referred to as partially depleted SOI constructions. Regardless, a conductive gate is positioned either above or below the SOI layer to provide gating between the diffusion regions in a transistor which is substantially horizontally oriented.

Field effect transistors constitute one common type of electronic device or component utilized in integrated circuitry. High density integrated circuitry is principally fabricated from semiconductor wafers. Upon fabrication completion, a wafer contains a plurality of identical discrete die areas which are ultimately cut from the wafer to form individual chips. Die areas or cut dies are tested for operability, with good dies being assembled into encapsulating packages which are used in end-products or systems.

One type of integrated circuitry comprises memory. The basic unit of semiconductor memory is the memory cell. Capable of storing a single bit of information, the memory cell has steadily shrunk in size to enable more and more cells per area of a semiconductor substrate or wafer. Such enables integrated memory circuitry to be more compact, as well as faster in operation.

Example semiconductor memories include ROMs, RAMs, PROMs, EPROMs, and EEPROMs. Some emphasize compactness and economy over speed. Other focus on lightening-fast operation. Some store data indefinitely, while others are so temporary they must be refreshed hundreds of times every second. One of the smallest memory cells comprises the single transistor and single capacitor of a dynamic random access memory (DRAM).

BRIEF DESCRIPTION OF THE DRAWINGS

Preferred embodiments of the invention are described below with reference to the following accompanying drawings.

FIG. 1 is a diagrammatic fragmentary sectional view of a semiconductor wafer fragment at one processing step in accordance with the invention.

FIG. 2 is a view of the FIG. 1 wafer fragment at a processing step subsequent to that shown by FIG. 1.

FIG. 3 is a diagrammatic top view of FIG. 2.

FIG. 16 is a diagrammatic sectional view of another alternate embodiment semiconductor wafer fragment in accordance with the invention.

FIG. 17 is a diagrammatic top view of FIG. 16.

DETAILED DESCRIPTION OF THE PREFERRED EMBODIMENTS

Figure 4:
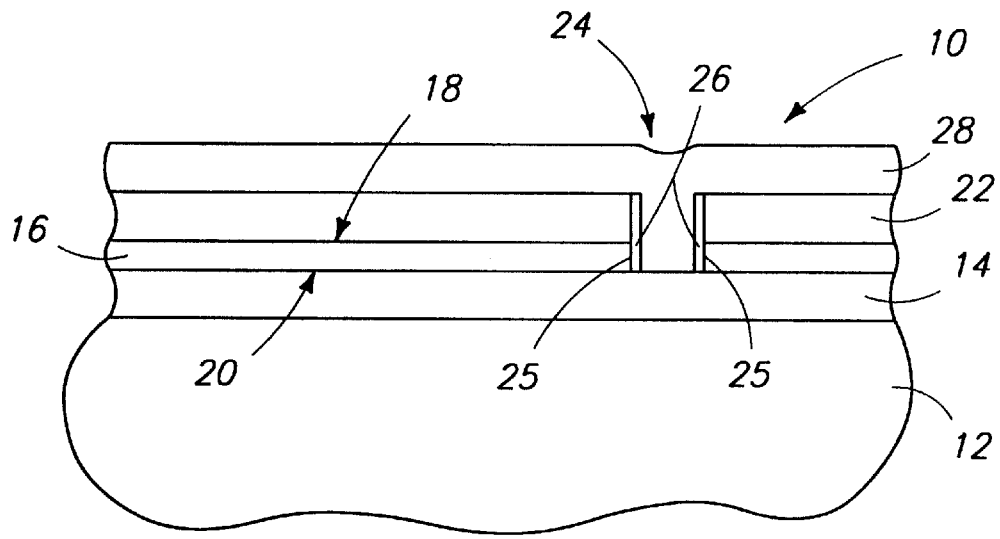
FIG. 4 is a sectional view of the FIG. 1 wafer fragment at a processing step subsequent to that depicted by FIG. 2.

This disclosure of the invention is submitted in furtherance of the constitutional purposes of the U.S. Patent Laws "to promote the progress of science and useful arts" (Article 1, Section 8).

The invention includes several aspects related to semiconductor-on-insulator transistors, to memory circuitry and arrays, to transistor gate arrays, and to methods of fabrication. In but one aspect, a semiconductor-on-insulator transistor comprises, an insulator layer;
a layer of semiconductor material over the insulator layer;
a transistor gate provided within the semiconductor material layer; and
an outer elevation source/drain diffusion region and an inner elevation diffusion region provided within the semiconductor material layer in operable proximity to the transistor gate.

In another aspect, memory circuitry comprises a plurality of memory cells not requiring sequential access, at least a portion of the plurality having more than two memory cells for a single bit line contact.

In still another aspect, a memory array of memory cells comprises a plurality of wordlines, source regions, drain regions, bit lines in electrical connection with the drain regions, and storage capacitors in electrical connection with the source regions; at least two drain regions of different memory cells being interconnected with one another beneath one of the wordlines.

These and other aspects of the invention will be appreciated from the following discussion which proceeds initially with respect to a first embodiment wafer fragment 10 of FIGS. 1–12. Wafer fragment 10 comprises a bulk monocrystalline silicon substrate 12 having an insulating layer 14 (i.e., silicon dioxide) provided thereover. An example thickness for layer 14 is from 2000 Angstroms to 5000 Angstroms. A layer 16 of semiconductor material is provide over insulating layer 14. An to example thickness for layer 16 is from 3000 Angstroms to 8000 Angstroms. Such typically and preferably comprises monocrystalline silicon. Accordingly, oxide layer 14 and bulk silicon 12 constitute a substrate on which semiconductor material layer 16 is deposited. For purposes of the continuing discussion, semiconductor-on-insulator layer 16 comprises an outer surface 18 and an inner surface 20. A protective and etch stop layer 22, preferably $SiO_2$, is provided outwardly of semiconductor-on-insulator layer 16. An example thickness is from 2000 Angstroms to 5000 Angstroms, with an example material being undoped $SiO_2$.

Referring to FIGS. 2 and 3, a transistor gate line opening 24 is patterned and etched through and within protective layer 22 thus, defining gate line opening sidewalls 25. In the depicted embodiment, gate line opening 24 is provided completely through semiconductor-on-insulator layer 16.

Referring to FIG. 4, gate line opening sidewalls 25 are provided with a gate dielectric layer 26, typically and preferably in the form of $SiO_2$ provided by thermal oxidation or by a deposition process. Thereafter, a layer 28 is deposited to completely fill the remaining portion of transistor gate opening 24.

Figure 5:
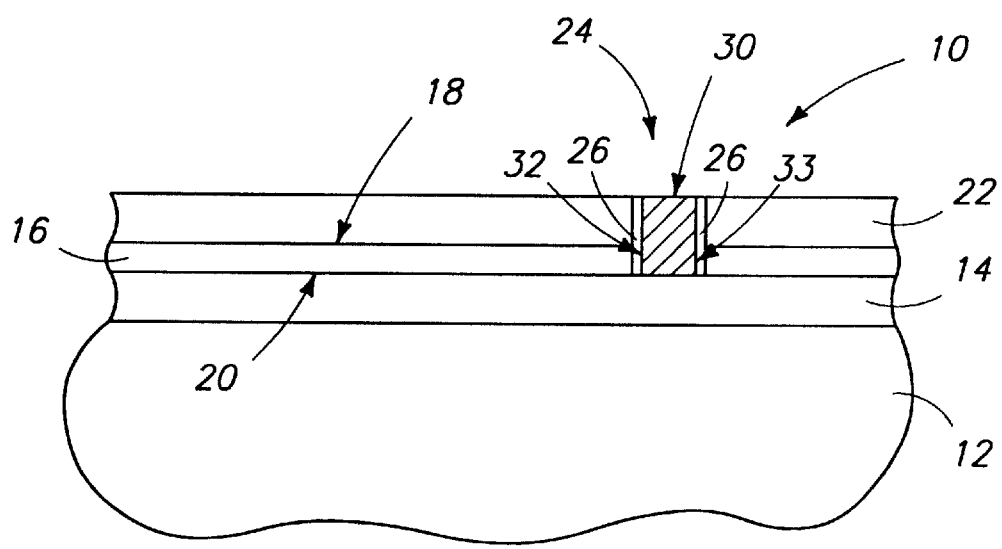
FIG. 5 is a view of the FIG. 1 wafer fragment at a processing step subsequent to that depicted by FIG. 4.

Referring to FIG. 5, such layer is preferably planarize etched, such as by chemical-mechanical polishing or resist etch back, to define an elongated conductive transistor gate line 30 which is ultimately rendered electrically conductive. Layer 28 as-deposited preferably comprises in situ conductively doped polysilicon, or other conductive material such as W, $WSi_x$, etc., such that gate line 30 is essentially electrically conductive immediately upon its formation. Accordingly, transistor gate 30 is provided within semiconductor material layer 16 and, in this depicted embodiment, extends completely through such layer. For purposes of the continuing discussion, elongated conductive gate line 30 has opposing lateral sides 32 and 33. Thus, transistor gate 30 is provided into semiconductor-on-insulated layer 16 from outer surface 18 to inner surface 20.

Figure 6:
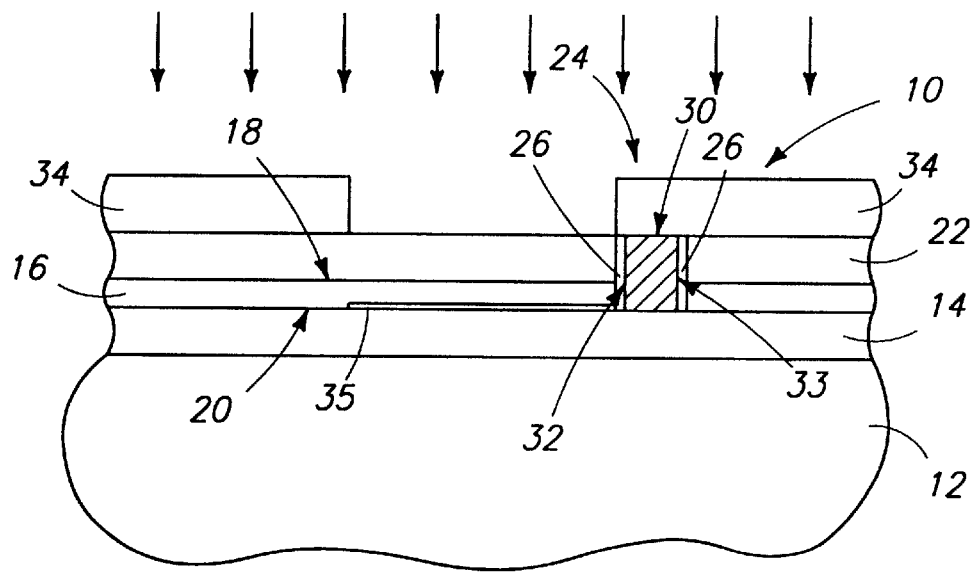
FIG. 6 is a view of the FIG. 1 wafer fragment at a processing step subsequent to that depicted by FIG. 5.
Figure 7:
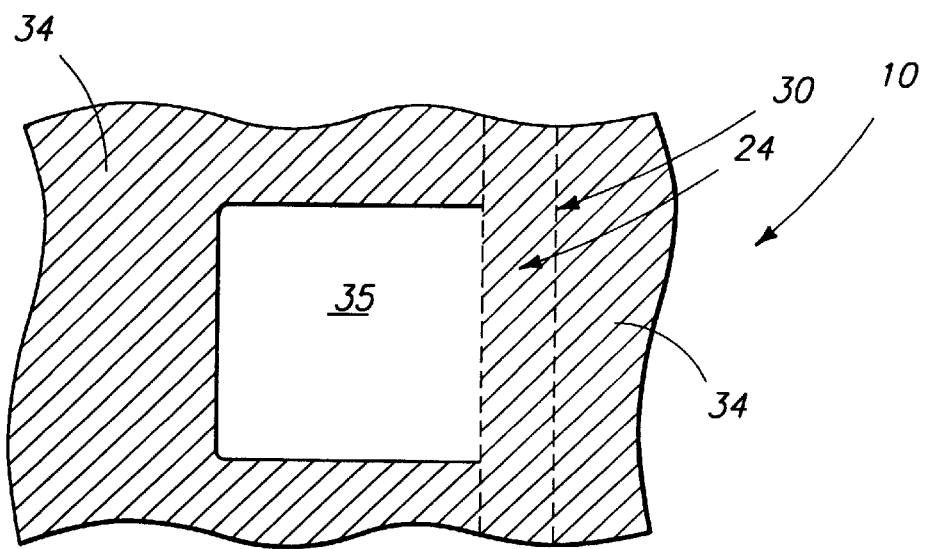
FIG. 7 is a diagrammatic top view of FIG. 6.

Referring to FIGS. 6 and 7, a first implant mask 34 is provided, with wafer 10 thereafter being subjected to ion implanting of n+ conductivity type doping to form a first inner elevation source/drain diffusion region 35 within semiconductor-on-insulator material layer 16 and at inner surface 20.

Figure 8:
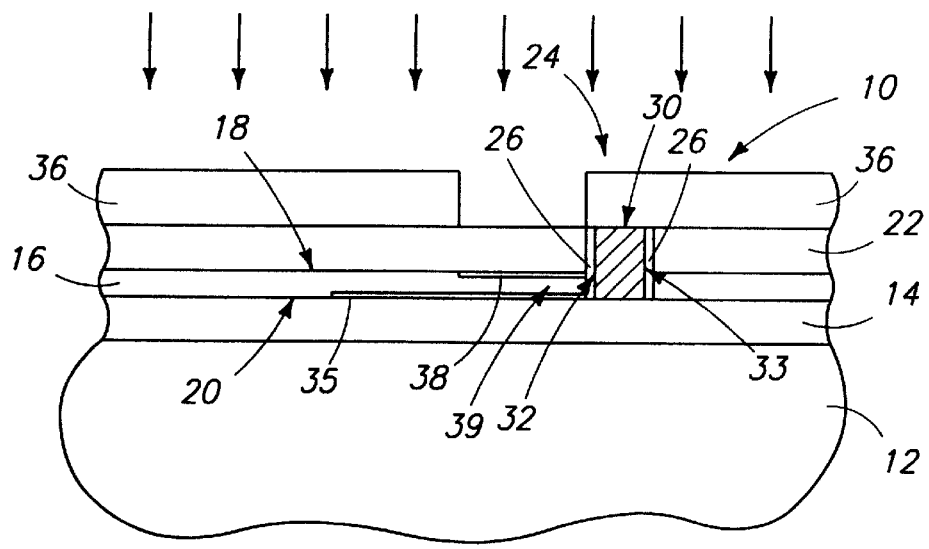
FIG. 8 is a view of the FIG. 1 wafer fragment at a processing step subsequent to that depicted by FIG. 6.
Figure 9:
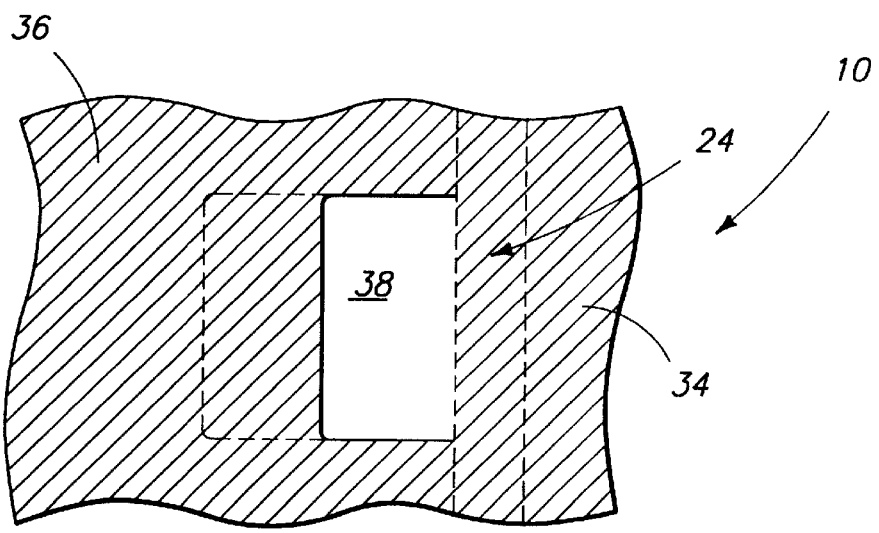
FIG. 9 is a diagrammatic top view of FIG. 8.

Referring to FIGS. 8 and 9, a second photoresist mask 36 is provided relative to wafer fragment 10 and ion implanting conducted to provide a second outer elevation source/drain diffusion region 38 of n+ type material at outer surface 18 of semiconductor-on-insulator layer 16, and spaced relative to first inner elevation diffusion region 35. The skilled artisan will appreciate that implant doses and energies can be selected to provide the illustrated implantations at the desired two different elevations. A field effect transistor channel region 39 is thereby defined elevationally between outer diffusion region 38 and inner diffusion region 35. Thus, the illustrated source/drain diffusion regions 35 and 38 are provided in operable proximity to channel region 39 and gate line 50. Transistor gate line 30 is positioned within semiconductor-on-insulator layer 16 effectively operably adjacent channel region 39 of such layer to enable establishing an electric field within channel region 39 upon application of suitable voltage to gate line 30. Gate line 30 accordingly is also positioned between elevationally spaced source/drain diffusion regions 35 and 38, as well as in the preferred embodiment extending elevationally along all of both source/drain diffusion regions to enable establishing an electric field therein upon application of voltage to the gate line 30. Alternately, a gate line might be fabricated to extend elevationally along only a portion of one or both source/drain diffusion regions.

The electric field established by application of voltage to the gate line within the subject diffusion regions is not anticipated to have an adverse effect on circuit operation due to the inherent heavy doping (i.e., $10^{20}$–$10^{21}$ ions/cm$^3$) in source/drain diffusion regions 35 and 38.

Figure 10:
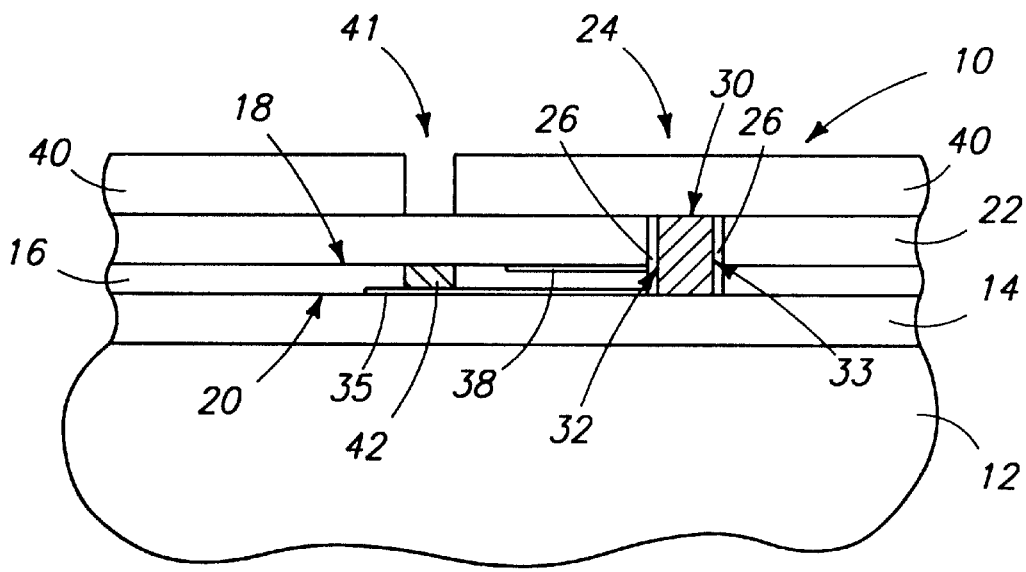
FIG. 10 is a view of the FIG. 1 wafer fragment at a processing step subsequent to that depicted by FIG. 8.

Referring to FIG. 10, another masking layer 40 is deposited, leaving an unmasked portion 41 through which ion implanting is conducted into semiconductor-on-insulator layer 16. Such forms an n+ electrically conductive plug contact 42 through semiconductor-on-insulator layer 16 to inner diffusion region 35.

Figure 11:
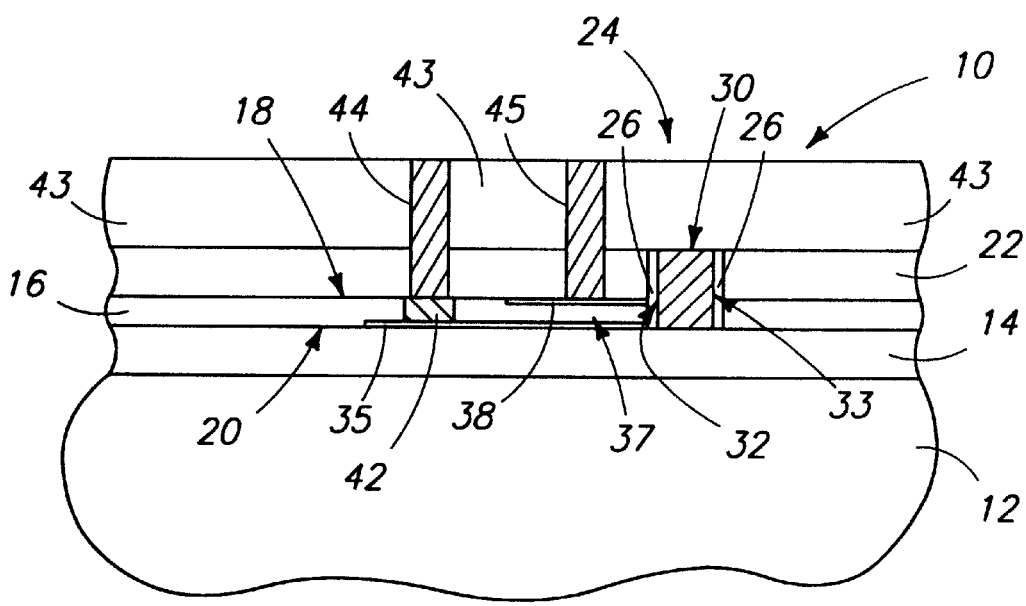
FIG. 11 is a view of the FIG. 1 wafer fragment at a processing step subsequent to that depicted by FIG. 10.
Figure 12:
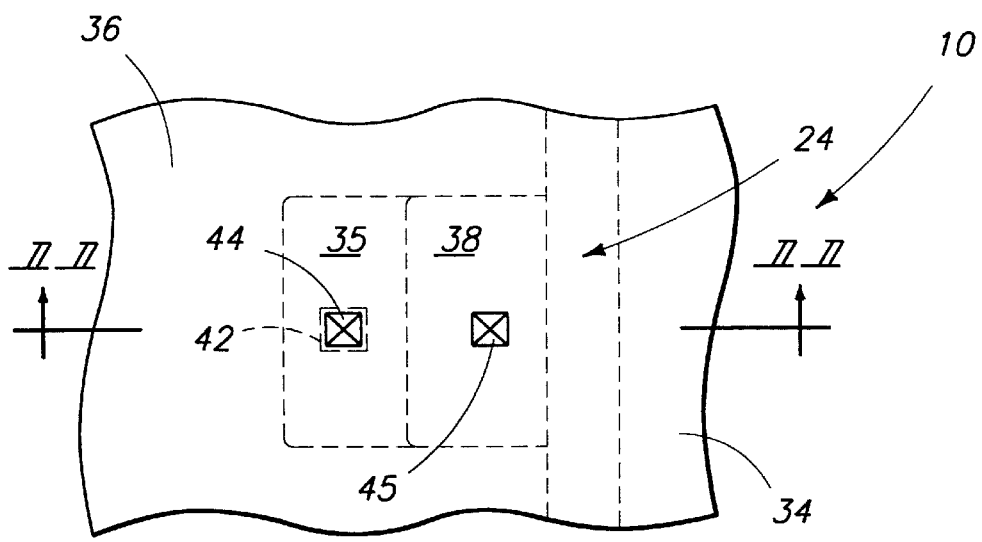
FIG. 12 is a diagrammatic top view of FIG. 11.

Referring to FIGS. 11 and 12, an insulating dielectric layer 43 is provided outwardly of etch stop layer 22. Such preferably comprises borophosphosilicate glass (BPSG). A first contact opening 44 is etched through BPSG layer 43 and etch stop layer 22 to conductive plug 42 and subsequently filled with conductive material thereby effectively electrically engages inner or first diffusion region 35. A second contact opening 45 is etched and filled with conductive material relative to and through BPSG layer 43 and etch stop layer 22 to second source/drain diffusion region 38. Thus in this described embodiment, first contact 44 and second contact 45 lie on one lateral side (lateral side 32) of gate line 30, and lie in a plane 11—11 (FIG. 12) running substantially perpendicular relative to the elongated nature of gate line 30.

Figure 13:
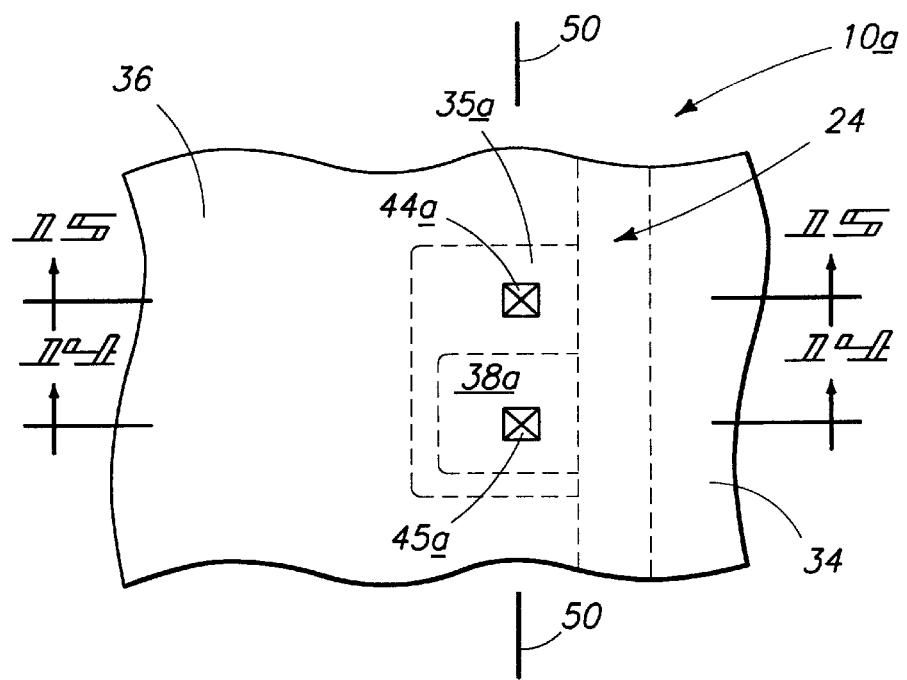
FIG. 13 is a diagrammatic top view of an alternate embodiment wafer fragment in accordance with the invention.
Figure 14:
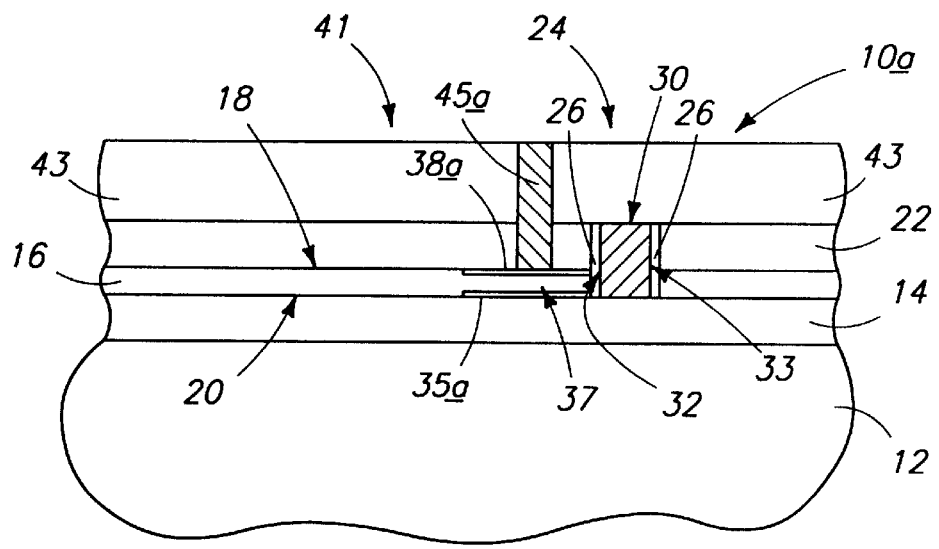
FIG. 14 is a sectional view of the FIG. 13 wafer fragment taken through line 14—14 in FIG. 13.
Figure 15:
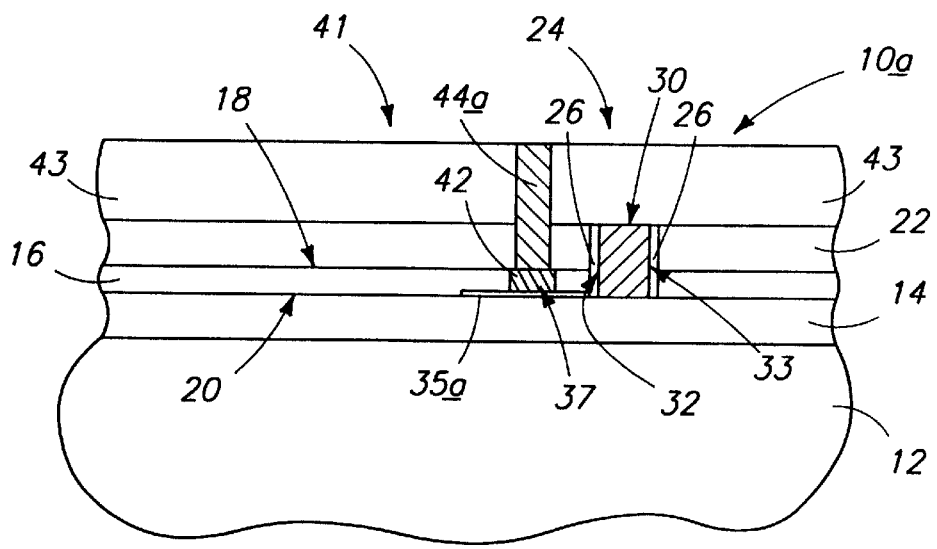
FIG. 15 is a sectional view of the FIG. 13 wafer fragment taken through line 15—15 in FIG. 13.

FIGS. 13–15 illustrate an alternate embodiment wafer fragment 10a. Like numerals from the first described embodiment are utilized where appropriate, with differences being indicated by the suffix "a" or with different numerals. Here, first electrical contact 44a and second electrical contact 45a lie on lateral side 32 of gate line 30 in a plane 50 (FIG. 13) which runs substantially parallel relative to gate line 30.

Memory circuitry, such as DRAM circuitry, in accordance with the invention is next described with reference to FIGS.

16 and 17. There illustrated is a semiconductor wafer fragment 55 having a bulk monocrystalline silicon substrate 56 and overlying insulating oxide layer 58. Semiconductor-on-insulator layer 60 is provided outwardly of oxide layer 58, and includes an example outer portion 61 and an inner portion 62. An n+ conductivity enhancing impurity is ion implanted into layer 60 inner portion 62 to form an implant region 64 which will comprise a common drain region to at least two, and preferably more, memory cells being formed.

In accordance with aspects of the above described first embodiments, a series of elongated and electrically conductive gate lines/wordlines 65a, 65b, 65c, etc. are ultimately provided within semiconductor-on-insulator 60. The troughs or openings from which such are formed are partially etched into semiconductor-on-insulator layer 60, typically utilizing a timed etch, so as not to penetrate and cut-off common drain region 64 of layer 60. A gate dielectric layer 66 is thereafter provided within the wordline openings. The wordline openings are subsequently filled with conductive material 65 to fill the remaining portion of the wordline troughs. Thereafter, a timed etch is conducted of material 65 to provide a recess relative to the outermost surface of semiconductor-on-insulator layer 60. The recess is subsequently filled with an electrically insulative material to provide electrically insulative caps 68 over the illustrated conductive portions 65.

Subsequently, suitable masking and ion implantation is conducted using an n+ conductivity enhancing impurity into outer portion 61 of semiconductor-on-insulator layer 60 to form the illustrated source regions 70a, 70b, 70c, etc. Thus, a region 71 of semiconductor-on-insulator layer 60 lies between sources 70 and drain 64, and constitutes channel regions of individual field effect transistors which are gatable by their associated word lines 65.

Two insulating dielectric layers 72 and 74 are provided outwardly of semiconductor-on-insulator 60. Capacitor construction 76a, 76b, 76c, etc. are provided relative to insulating dielectric layer 72 as shown outwardly of semiconductor-on-insulator layer 60. Such capacitors individually comprise a storage node 77 and a capacitor dielectric layer 78. A common capacitor cell plate node 80 is provided outwardly of the capacitor dielectric layer and is commonly interconnected with all capacitors throughout the array. Accordingly, each storage capacitor 76 is in electrical contact with one of source regions 70 of each associated field effect transistor, with each so coupled capacitor and field effect transistor constituting a single memory cell of a DRAM array.

A conductive implant and plug 79 is provided within semiconductor-on-insulator layer 60 for providing electrical contact to common drain region 64. A conductive plug 82 is provided within insulating dielectric layers 72 and 74, and thereby ohmically connects with drain plugs 79. A series of bit lines 84 is provided outwardly of insulating dielectric layer 74. Such run perpendicular with the word lines, with individual bit lines ohmically connecting with conductive drain plugs 82/79.

Heretofore, prior art memory arrays having memory cells provided along a line perpendicular to the word lines that did not require sequential access had a maximum of two memory cells sharing a single bit line contact. However in accordance with the above described preferred embodiment, more than two memory cells along a line are associated with a single bit line contact. The illustrated common drain implant 64 would be patterned in the shape of a line running beneath and substantially parallel with the associated bit lines. The number of contacts required for a given series of associated capacitors would be limited by the relative resistance associated with each individual common drain line region 64. For a conductivity enhancing dopant concentration for region 64 of about $10^{20}$ ions/cm$^3$, it is expected that up to eight (8) capacitors can be associated along a line for a single bit line contact 79/82. Accordingly in the preferred embodiment, four, five, six, seven, eight or more memory cells can be associated with a single bit contact. The applicant/patentee is aware of no prior art memory array constructions allowing for such which do not also require sequential access of memory cells along such lines.

The above described preferred embodiment also provides a preferred embodiment construction of memory circuitry, such as DRAM circuitry, comprising a plurality of memory cells having field effect transistors which are formed substantially vertically within a semiconductor-on-insulator layer. Also in such preferred embodiment, capacitors of a plurality of such memory cells lie outwardly of the semiconductor-on-insulator layer.

Further in accordance with the above described preferred embodiment, a memory array comprises at least two memory cells having their drain regions interconnected with one another and running beneath at least one of the wordlines of one of such memory cells.

Even further in accordance with the preferred embodiment, novelty lies in a memory array of memory cells wherein a plurality of the wordlines within the array are formed within and through a semiconductor-on-insulator layer. Also, memory cells in accordance with the above describe embodiment enable fabrication of DRAM arrays wherein individual memory cells occupy a surface area of less than 6f$^2$, where "f" is the minimum photolithographic feature dimension with which the array is fabricated. 6f$^2$ has heretofore been understood to be the minimum practical lower limit of the size for a single DRAM memory cell which does not require sequential access along a line of such cells running perpendicular to a series of wordlines.

Even more specifically, the above described preferred embodiment enables creation of plurality of individual memory cells within a portion of an array which individually occupy a surface area of less than or equal to 2f×(2f+f/N), where "N" is the number of memory cells per single bit line contact within the particular portion or line. Accordingly the smaller the value of "f" and the greater value of "N", the lower the occupied area for a given DRAM memory cell. For example where N=8, the approximate individual memory cell size can be reduced to 4.25f$^2$.

Regardless of DRAM or other memory circuitry, the above described example also enables provision of a transistor gate array wherein gate lines of the array are provide within and preferably completely through a semiconductor-on-insulator, with the gate lines running substantially parallel to one another within such layer. Such array of gates in the illustrated embodiment preferably does not extend all the way through the semiconductor-on-insulator layer, as shown above in the illustrated. DRAM circuitry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a semiconductor on insulator transistor comprising the following steps:

forming a semiconductor material layer on a substrate, patterning a transistor gate line opening completely through the semiconductor material layer, the transistor gate line opening having opposing sidewalls;

forming a gate dielectric layer over the gate line opening sidewalls;

after forming the gate dielectric layer, filling the transistor gate line opening with electrically conductive material;

providing a channel region within the semiconductor material layer operably adjacent the transistor gate line opening; and forming a pair of source/drain regions of the semiconductor-on-insulator transistor in operable proximity to the channel region by ion implanting of a conductivity enhancing impurity using two different masking steps to two different elevations within the semiconductor material layer, the drain region being formed on one of the sidewalls of the transistor gate line opening and not extending to below the transistor gate, there being no drain region on the other of the opposing sidewall of the transistor gate line opening.

2. The method of forming a semiconductor-on-insulator transistor of claim 1 wherein, after forming the gate dielectric layer, the electrically conductive material fills an entire remainder of the transistor gate line opening.

3. The method of forming a semiconductor-on-insulator transistor of claim 1 further comprising providing an etch stop layer outwardly of the semiconductor layer prior to providing the transistor gate line opening therein.

4. A method of forming a semiconductor-on-insulator transistor comprising the following steps:

forming a semiconductor material layer on a substrate;

patterning a transistor gate line opening within the semiconductor material layer, the transistor gate line opening having opposing sidewalls;

forming a gate dielectric layer over the gate line opening sidewalls;

after forming the gate dielectric layer, filling the transistor gate line opening with electrically conductive material;

providing a channel region within the semiconductor material layer operably adjacent the transistor gate line opening; and forming a pair of source/drain regions of the semiconductor-on-insulator transistor within the semiconductor material layer in operable proximity to the channel region, the drain region being formed on one of the sidewalls of the transistor gate line opening and not extending to below the transistor gate, there being no drain region on the other of the opposing sidewall of the transistor gate line opening, one of the source/drain diffusion regions comprising an outer region, and the other of the source/drain diffusion regions comprising an inner diffusion region;

masking the semiconductor material layer to define a masked portion and an unmasked portion; and ion implanting into the unmasked portion of the semiconductor material layer to form an electrically conductive plug contact to the inner diffusion region through the semiconductor material layer.

5. The method of forming a semiconductor-on-insulator transistor of claim 4 wherein the pair of source/drain regions are provided within the semiconductor material layer by ion implanting of a conductivity enhancing impurity to two different elevations within the semiconductor material layer.

6. The method of forming a semiconductor-on-insulator transistor of claim 4 wherein the pair of source/drain regions are provided within the semiconductor material layer by ion implanting of a conductivity enhancing impurity using two different masking steps to two different elevations within the semiconductor material layer.

7. The method of forming a semiconductor-on-insulator transistor of claim 4 wherein the gate line opening is provided completely through the semiconductor material layer.

8. The method of forming a semiconductor-on-insulator transistor of claim 4 wherein the gate line opening is provided only partially through the semiconductor material layer.

9. The method of forming a semiconductor-on-insulator transistor of claim 4 further comprising providing an etch stop layer outwardly of the semiconductor layer prior to providing the transistor gate line opening therein.

10. A method of forming a semiconductor-on-insulator transistor comprising the following steps:

forming a semiconductor material layer on a substrate;

patterning a transistor gate line opening within the semiconductor material layer, the transistor gate line opening having opposing sidewalls;

forming a gate dielectric layer over the gate line opening sidewalls;

after forming the gate dielectric layer, filling the transistor gate line opening with electrically conductive material;

providing a channel region within the semiconductor material layer operably adjacent the transistor gate line opening; and after the filling the transistor gate line, forming a pair of source/drain regions of the semiconductor-on-insulator transistor in operable proximity to the channel region, the drain region being formed on one of the sidewalls of the transistor gate line opening and not extending to below the transistor gate, there being no drain region on the other of the opposing sidewall of the transistor gate line opening.

11. The method of forming a semiconductor-on-insulator transistor of claim 10 wherein the pair of source/drain regions are provided within the semiconductor material layer.

12. The method of forming a semiconductor-on-insulator transistor of claim 10 wherein the pair of source/drain regions are provided within the semiconductor material layer, the gate line opening being provided completely through the semiconductor material layer.

13. The method of forming a semiconductor-on-insulator transistor of claim 10 wherein the pair of source/drain regions are provided within the semiconductor material layer, the gate line opening being provided only partially through the semiconductor material layer.

14. The method of forming a semiconductor-on-insulator transistor of claim 10 wherein the gate line opening is provided completely through the semiconductor material layer.

15. The method of forming a semiconductor-on-insulator transistor of claim 10 wherein the gate line opening is provided only partially through the semiconductor material layer.

16. The method of forming a semiconductor-on-insulator transistor of claim 10 wherein the pair of source/drain regions are provided within the semiconductor material layer by ion implanting of a conductivity enhancing impurity to two different elevations within the semiconductor material layer.

17. The method of forming a semiconductor-on-insulator transistor of claim 10 wherein the pair of source/drain regions are provided within the semiconductor material layer by ion implanting of a conductivity enhancing impurity using two different masking steps to two different elevations within the semiconductor material layer.

18. The method of forming a semiconductor-on-insulator transistor of claim 10 further comprising providing an etch stop layer outwardly of the semiconductor layer prior to providing the transistor gate line opening therein.

19. A method of forming a semiconductor-on-insulator transistor comprising the following steps:

forming a semiconductor material layer on a substrate;

patterning a transistor gate line opening completely through the semiconductor material layer, the transistor gate line opening having opposing sidewalls;

forming a gate dielectric layer over the gate line opening sidewalls;

after forming the gate dielectric layer, filling the transistor gate line opening with electrically conductive material;

providing a channel region within the semiconductor material layer operably adjacent the transistor gate line opening; and forming a pair of source/drain regions of the semiconductor-on-insulator transistor in operable proximity to the channel region by ion implanting of a conductivity enhancing impurity using two different masking steps to two different elevations within a singly formed portion of the semiconductor material layer, the drain region being formed on one of the sidewalls of the transistor gate line opening and not extending to below the transistor gate, there being no drain region on the other of the opposing sidewall of the transistor gate line opening.

\* \* \* \* \*

UNITED STATES PATENT AND TRADEMARK OFFICE
CERTIFICATE OF CORRECTION

PATENT NO.    : 6,586,304 B2
DATED         : July 1, 2003
INVENTOR(S)   : Kirk Prall It is certified that error appears in the above-identified patent and that said Letters Patent is hereby corrected as shown below:

Column 3
Line 30, replace "insulating layer 14. An to example thickness for layer 16 is" with
-- insulating layer 14. An example thickness for layer 16 is --.

Column 4,
Line 20, replace "gate line 50. Transistor gate line 30 is positioned within" with
-- gate line 30. Transistor gate line 30 is positioned within --.

Column 6,
Line 51, replace "gate array wherein gate lines of the array are provide" with
-- gate array wherein gate lines of the array are provided --.

Column 7,
Line 47, replace "opening; and" with -- opening; --.

Signed and Sealed this

Twentieth Day of September, 2005

JON W. DUDAS
*Director of the United States Patent and Trademark Office*